US006922163B2

United States Patent
Nanba et al.

(10) Patent No.: US 6,922,163 B2
(45) Date of Patent: *Jul. 26, 2005

(54) SEMICONDUCTOR INTEGRATED CIRCUIT

(75) Inventors: Hiromi Nanba, Kawasaki (JP); Toru Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/770,749

(22) Filed: Feb. 4, 2004

(65) Prior Publication Data

US 2004/0227546 A1 Nov. 18, 2004

Related U.S. Application Data

(63) Continuation-in-part of application No. 10/060,392, filed on Feb. 1, 2002, now Pat. No. 6,738,001, which is a continuation-in-part of application No. 09/663,842, filed on Sep. 15, 2000, now abandoned.

(30) Foreign Application Priority Data

May 12, 2000 (JP) ........................................ 2000-140034
Apr. 27, 2001 (JP) ........................................ 2001-132688

(51) Int. Cl.[7] ................................................ H03M 1/66
(52) U.S. Cl. ........................ 341/145; 341/144; 341/118
(58) Field of Search ................................ 341/126, 144, 341/145, 155, 156, 118, 120, 121

(56) References Cited

U.S. PATENT DOCUMENTS

| 4,862,170 | A | * | 8/1989 | Hashimoto et al. ......... 341/144 |
| 5,323,159 | A | * | 6/1994 | Imamura et al. ............ 341/145 |
| 5,515,047 | A | | 5/1996 | Yamakido et al. |
| 5,995,030 | A | * | 11/1999 | Cabler ........................ 341/143 |
| 6,738,001 | B2 | * | 5/2004 | Nanba et al. ............... 341/144 |

FOREIGN PATENT DOCUMENTS

JP 6-303137 10/1994

* cited by examiner

Primary Examiner—John B Nguyen
(74) Attorney, Agent, or Firm—Arent Fox PLLC

(57) ABSTRACT

A semiconductor integrated circuit comprises a digital-to-analogue converter for converting a digital signal into an analogue signal to output an analogue current signal, a current-to-voltage converter for converting the analogue current signal output by the digital-to-analogue converter, into an analogue voltage signal whose level has been controlled, and a filter for filtering the analogue voltage signal converted by the current-to-voltage converter. The current-to-voltage converter converts the current signal into the voltage signal in which a factor variable in accordance with manufacturing process conditions and/or environmental conditions has been corrected.

21 Claims, 12 Drawing Sheets

F I G. 1
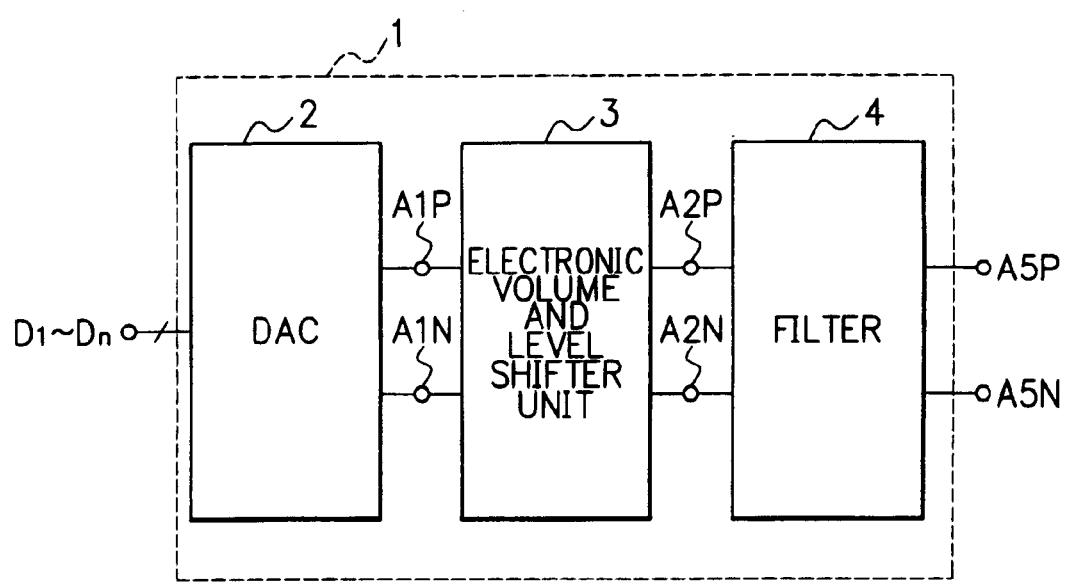

F I G. 2A
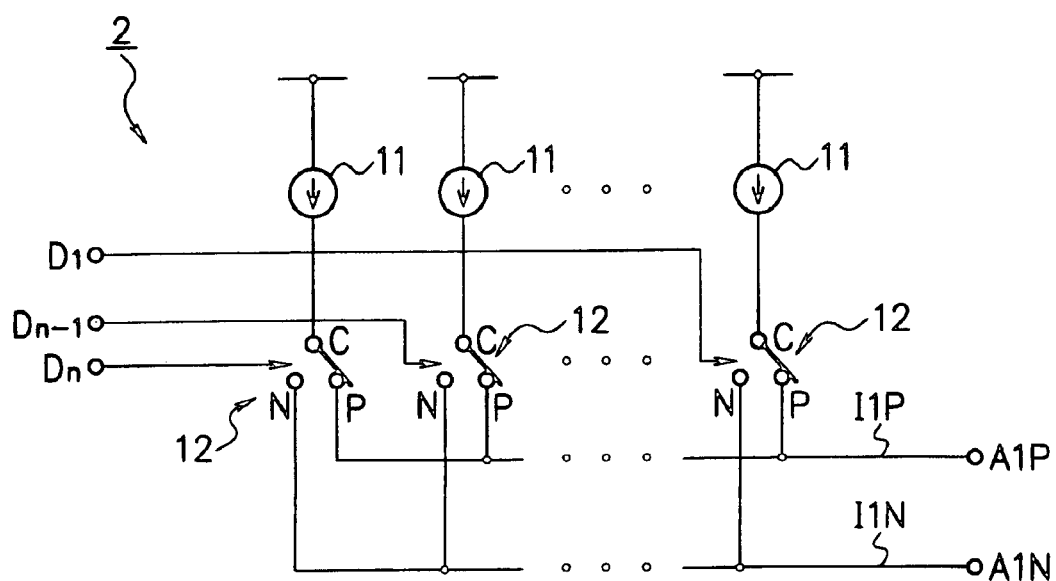
F I G. 2B
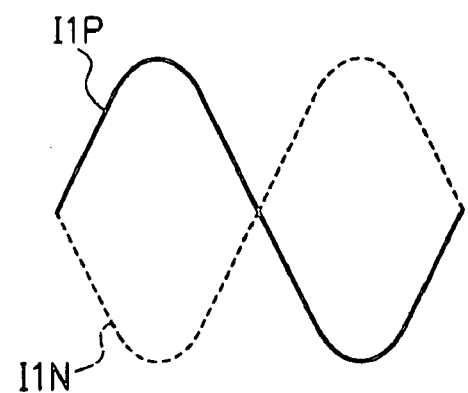

F I G. 7
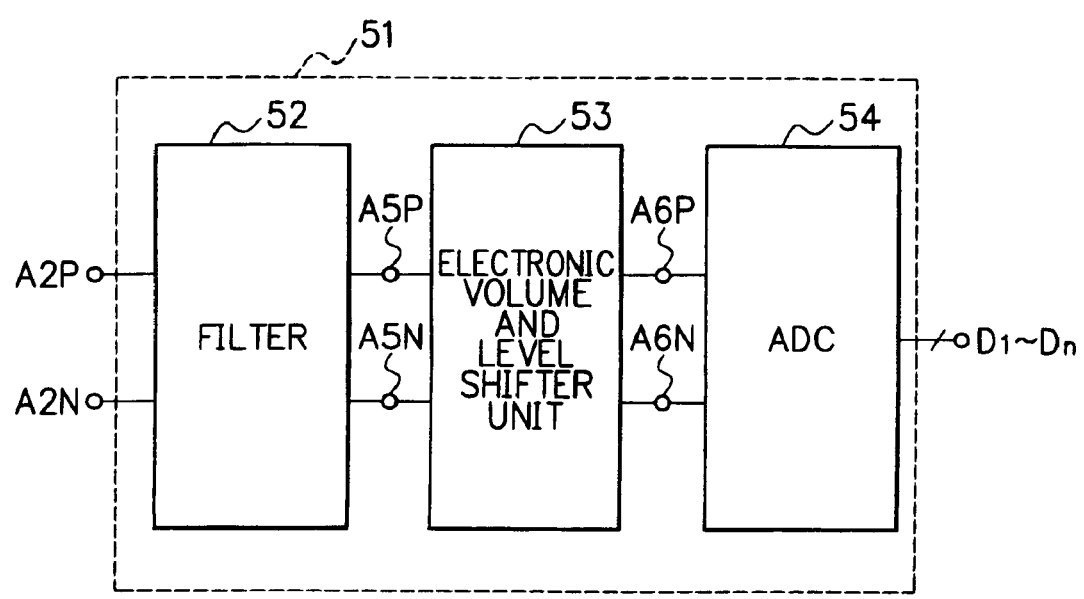

F I G. 8
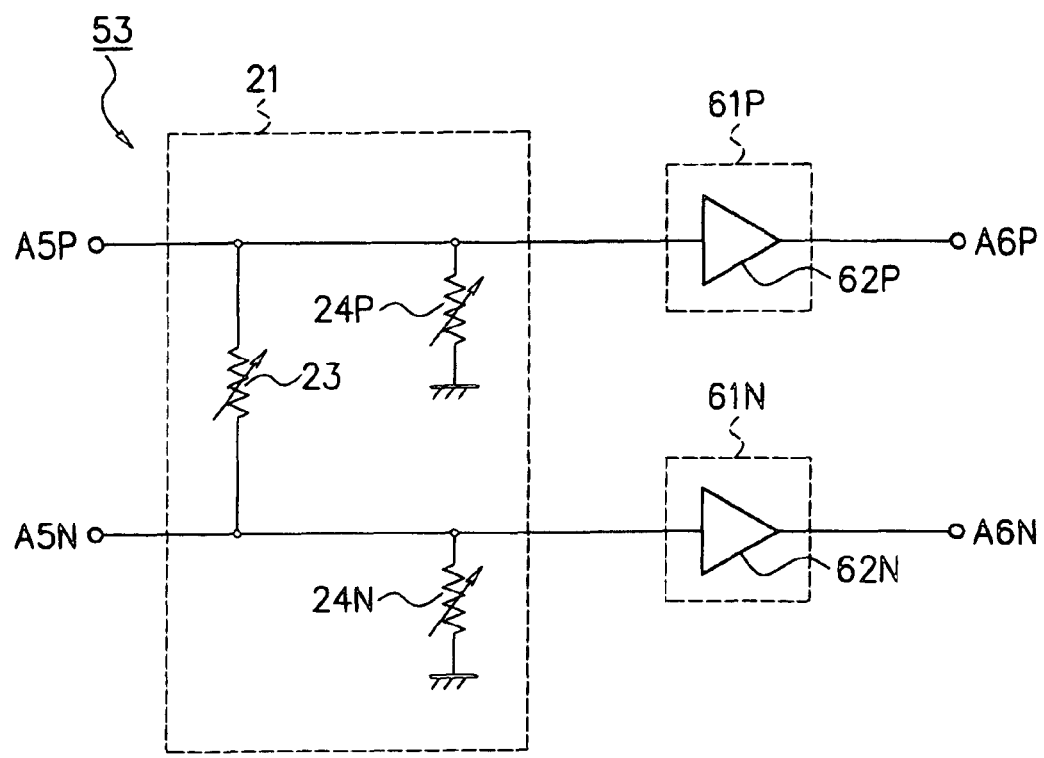

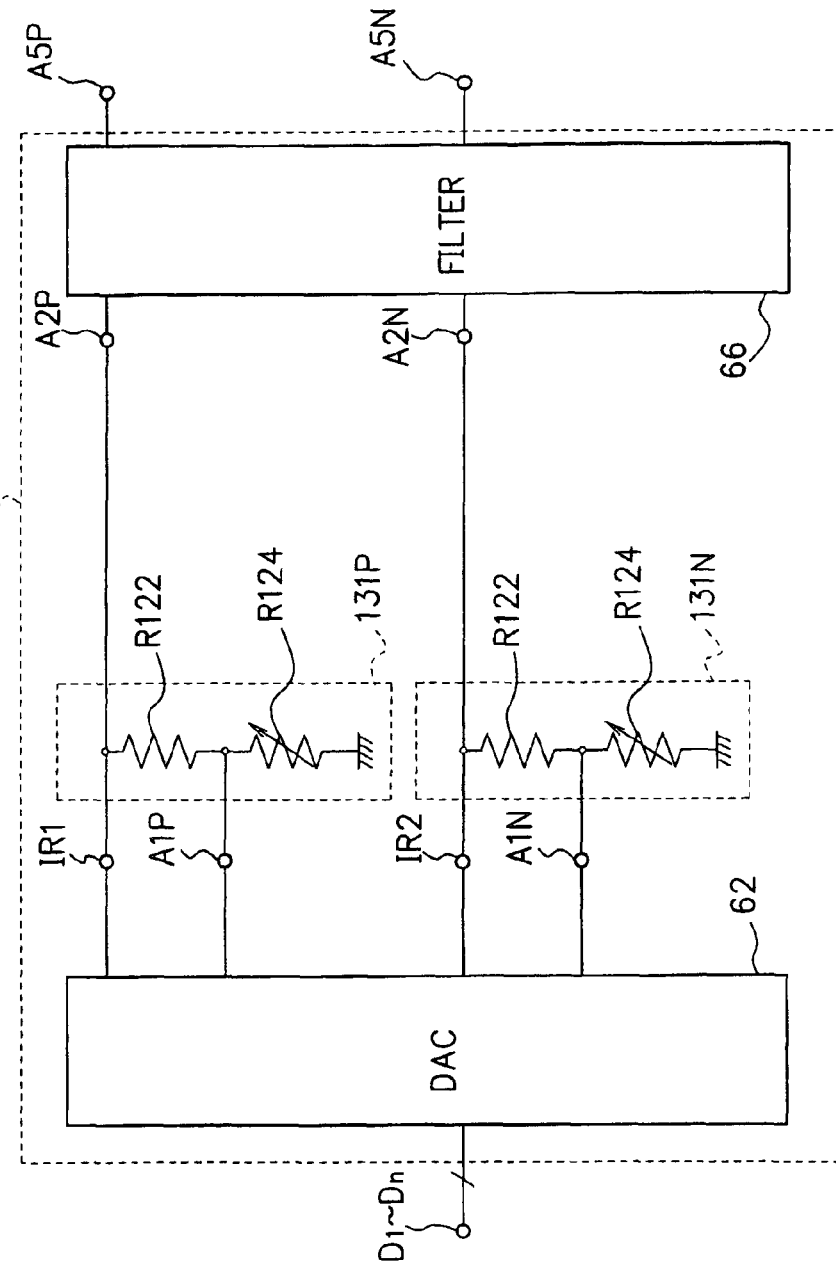

SEMICONDUCTOR INTEGRATED CIRCUIT

CROSS-REFERENCE TO RELATED APPLICATIONS

This is a Continuation of Application Ser. No. 10/060,392 filed on Feb. 1, 2002 now U.S. Pat. No. 6,738,001 which is a Continuation-in-Part of application Ser. No. 09/663,842 filed on Sep. 15, 2000 (now being abandoned). The disclosure of the prior application is hereby incorporated by reference herein in its entirety.

This application is based upon and claims priority of Japanese Patent Application Nos. 2000-140034 and 2001-132688, filed on May 12, 2000 and Apr. 27, 2001, the contents being incorporated herein by reference.

BACKGROUND OF THE INVENTION

1. Field of the Invention

The present invention relates to semiconductor integrated circuits for digital-to-analogue or analogue-to-digital conversion, particularly suitable for use in portable telephones, automobile telephones, cordless telephones, image processors, etc.

2. Description of the Related Art

FIG. 10 shows the construction of a conventional digital-to-analogue (D/A) converting system. A D/A converter (DAC) 101 converts n-bit digital signals D1 to Dn into an analogue current signal, and then outputs it. A resistance 102 has the function of converting the current signal into a voltage signal. Between both terminals of the resistance 102, an analogue voltage appears in accordance with the analogue current output by the D/A converter 101. A low pass filter (LPF) 103 filters the analogue voltage signal generated by the resistance 102, to pass only its low frequency components. The filter 103 thereby outputs an analogue voltage signal.

An electronic volume 107 comprises a reversal operational amplifier including an operational amplifier 106, a fixed resistance 104, and a variable resistance 105. The ratio of the fixed resistance 104 to the variable resistance 105 determines the amplification factor of the electronic volume 107. For controlling dispersion in manufacturing process, the output level of each such D/A converting system must be regulated before shipment as products, by changing the value of the variable resistance 105 in the electronic volume 107.

The electronic volume 107 is thus necessary for controlling dispersion in manufacturing process of such D/A converting systems. But, it requires a large area. More specifically, since the electronic volume 107 includes the operational amplifier 106, it cannot but occupy a large area on the semiconductor chip. This causes an increase in size of the whole D/A converting system.

Such D/A converting systems are used in portable telephones or the like, and their high speed operation has been required recently. The above-described low pass filter 103 is an RC type low pass filter with its input and output by voltage, and includes about five operational amplifiers in general. Conventionally, these D/A converting systems were operated at a relatively low speed, so the current consumption of each operational amplifier in the low pass filter 103 was little. In recent years, however, because of the demand for high speed operation of these D/A converting systems, the current consumption of each operational amplifier in the low pass filter 103 has increased to the extent of 2 to 3 mA. In addition, the current consumption of the operational amplifier 106 in the electronic volume 107 is also much. Consequently, the power consumption of the D/A converting system becomes much. This causes short battery lives in portable telephones or the like.

Besides, conventionally, discrete cells of an existing D/A converter 101, an existing low pass filter 103, and an existing electronic volume 107 which are designed individually, are combined into one semiconductor chip, and a resistance 102 is connected as an external resistance to the semiconductor chip. Such an exterior type resistance 102 can bring about a highly accurate fixed resistance, but causes an increase in size of the whole D/A converting system.

FIG. 11 shows the construction of a conventional analogue-to-digital (A/D) converting system. A low pass filter (LPF) 111 is an RC type low pass filter with its input and output by voltage, like the above-described low pass filter 103. The filter 111 filters an analogue voltage signal AN to pass only its low frequency components. The filter 111 thereby outputs a filtered analogue voltage signal. An electronic volume 116 includes an operational amplifier 114, a fixed resistance 112, and a variable resistance 113, like the above-described electronic volume 107. The level of the analogue voltage signal filtered by the low pass filter 111 can be controlled by changing the value of the variable resistance 113. An A/D converter (ADC) 115 converts the analogue voltage signal whose level has been adjusted by the electronic volume 116, into n-bit digital signals D1 to Dn.

Also in this A/D converting system, like the case of the above-described D/A converting system (see FIG. 10), the electronic volume 116 is necessary for controlling dispersion in manufacturing process of such A/D converting systems, but the electronic volume 116 requires a large area, and thus causes an increase in size of the whole A/D converting system.

Besides, also in this A/D converting system, either of the current consumption of each operational amplifier in the low pass filter 111 and the current consumption of the operational amplifier 114 in the electronic volume 116 is much, and it causes short battery lives in a portable telephone or the like using this A/D converting system.

As described above, in either of the conventional D/A and A/D converting systems, the size of the whole system becomes large because the electronic volume with the operational amplifier occupies a large area.

Besides, since either of the current consumption of each operational amplifier in the low pass filter and the current consumption of the operational amplifier in the electronic volume is much, it causes short battery lives in a portable telephone or the like using such a D/A or A/D converting system.

Furthermore, in the D/A converting system (see FIG. 10), the D/A converter 101, the low pass filter 103, and the electronic volume 107 are provided within one semiconductor chip, and the resistance 102 is connected as an external resistance to the semiconductor chip. This causes an increase in size of the whole D/A converting system.

SUMMARY OF THE INVENTION

It is an object of the present invention to make such an electronic volume as described above with no operational amplifier, thereby realizing reduced-size D/A or A/D converting systems.

It is another object of the present invention to reduce the current consumption of such an electronic volume, thereby realizing D/A or A/D converting systems with their reduced power consumption.

It is still another object of the present invention to reduce the current consumption of such a filter as described above, thereby realizing D/A or A/D converting systems with their reduced power consumption.

It is still another object of the present invention to provide reduced-size D/A converting systems by using an element that has both the function of a resistance for converting an analogue current signal output by a D/A converter, into an analogue voltage signal, and the function of such an electronic volume as described above.

It is still another object of the present invention to provide semiconductor integrated circuits capable of outputting stable voltages irrespective of manufacturing process conditions and/or environmental conditions.

According to an aspect of the present invention, a semiconductor integrated circuit comprises a digital-to-analogue converter for converting a digital signal into an analogue signal to output an analogue current signal, a current-to-voltage converter for converting the analogue current signal output by the digital-to-analogue converter, into an analogue voltage signal whose level has been controlled, and a filter for filtering the analogue voltage signal converted by the current-to-voltage converter. The current-to-voltage converter converts the current signal into the voltage signal in which a factor variable in accordance with manufacturing process conditions and/or environmental conditions has been corrected.

According to another aspect of the present invention, a semiconductor integrated circuit comprises a filter for filtering an input signal to output a filtered analogue current signal, a current-to-voltage converter for converting the analogue current signal output by the filter, into an analogue voltage signal whose level has been controlled, and an analogue-to-digital converter for converting the analogue voltage signal converted by the current-to-voltage converter, into a digital signal. The current-to-voltage converter converts the current signal into the voltage signal in which a factor variable in accordance with manufacturing process conditions and/or environmental conditions has been corrected.

According to either aspect, since the current-to-voltage converter converts the current signal into the voltage signal in which a factor variable in accordance with manufacturing process conditions and/or environmental conditions has been corrected, the circuit can output a stable voltage signal irrespective of dispersion in manufacturing process and/or a change in environmental conditions for operation.

BRIEF DESCRIPTION OF THE DRAWINGS

FIG. 1 is a block circuit diagram showing the construction of a semiconductor integrated circuit to realize a D/A converting system according to an embodiment of the present invention;

FIG. 2A is a schematic circuit diagram showing the construction of the D/A converter shown in FIG. 1;

FIG. 2B is a waveform chart for explaining the operation of the D/A converter;

FIG. 7 is a block circuit diagram showing the construction of a semiconductor integrated circuit to realize an A/D converting system according to an embodiment of the present invention;

FIG. 8 is a circuit diagram showing the construction of the electronic volume and level shifter unit shown in FIG. 7;

FIG. 13 is a block circuit diagram showing the construction of a semiconductor integrated circuit to realize a D/A converting system according to an embodiment of the present invention.

DETAILED DESCRIPTION OF THE PREFERRED EMBODIMENTS

Hereinafter, embodiments of the present invention will be described with reference to drawings.

FIG. 1 is a block circuit diagram showing the construction of a semiconductor integrated circuit 1 to realize a digital-to-analogue (D/A) converting system according to an embodiment of the present invention. The semiconductor integrated circuit 1 is made into a single semiconductor chip, and includes a D/A converter (DAC) 2, an electronic volume and level shifter unit 3, and a filter 4. The D/A converter 2 is provided with an input signal line for inputting n-bit digital signals D1 to Dn, a positive analogue output signal line connected to a positive terminal A1P, and a negative analogue output signal line connected to a negative terminal A1N. The electronic volume and level shifter unit 3 is provided with a positive analogue input signal line connected to the positive terminal A1P, a negative analogue input signal line connected to the negative terminal A1N, a positive analogue output signal line connected to a positive terminal A2P, and a negative analogue output signal line connected to a negative terminal A2N. The filter 4 is provided with a positive analogue input signal line connected to the positive terminal A2P, a negative analogue input signal line connected to the negative terminal A2N, a positive analogue output signal line connected to a positive terminal A5P, and a negative analogue output signal line connected to a negative terminal A5N.

Figure 10:
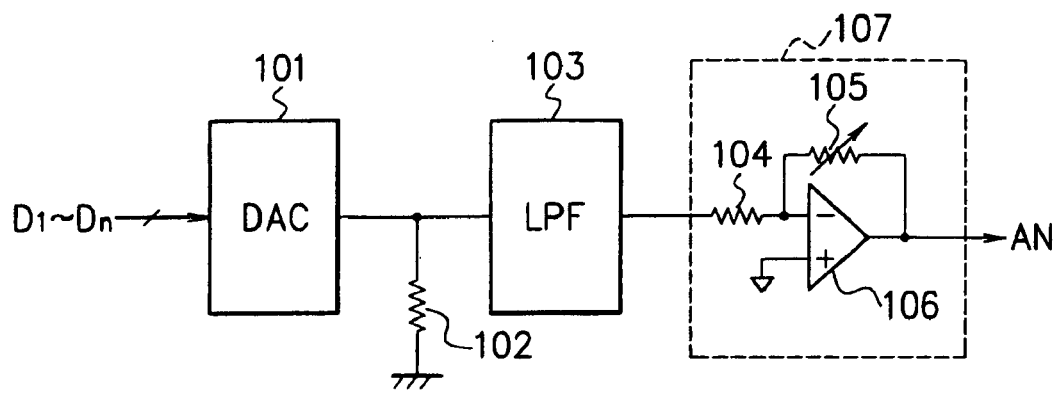
FIG. 10 is a block circuit diagram showing the construction of a conventional D/A converting system.

The D/A converter 2 having received n-bit digital signals D1 to Dn converts them into analogue signals, and outputs differential analogue current signals unlike the D/A converter 101 shown in FIG. 10. The differential analogue current signals comprise a positive current signal and a negative current signal reverse in phase to each other. The positive current signal is output to the positive terminal A1P through the positive analogue output signal line of the D/A converter 2. The negative current signal is output to the negative terminal A1N through the negative analogue output signal line of the D/A converter 2. Such current output type D/A converters as this D/A converter 2 are more suitable for high-speed processing in comparison with voltage output type D/A converters. The internal construction of this D/A converter 2 will be described later with reference to FIGS. 2A and 2B.

The electronic volume and level shifter unit 3 has both functions of a current-to-voltage (current/voltage) converter and an electronic volume. The electronic volume and level shifter unit 3 converts the differential analogue current signals output by the D/A converter 2, into differential analogue voltage signals whose levels have been controlled. More specifically, the electronic volume and level shifter unit 3 can control the level of the DC component and the amplitude of the AC component of each differential analogue voltage signal. The electronic volume and level shifter unit 3 further has the function of a level shifter. In order to obtain a voltage level necessary for input of the filter 4, the electronic volume and level shifter unit 3 raises (shifts) the levels of the respective DC components of the positive voltage signal and the negative voltage signal, and then outputs the differential analogue voltage signals to the filter 4. This electronic volume and level shifter unit 3 has both the function of the electronic volume 107 and the function of the resistance 102 as a current/voltage converter in the conventional D/A converting system shown in FIG. 10. It, therefore, requires no exterior type fixed resistance. This makes it possible to realize a reduced-size semiconductor integrated circuit 1. The internal construction of this electronic volume and level shifter unit 3 will be described later with reference to FIGS. 3A and 3B.

The filter 4 is a gm-C type low pass filter for removing noise. The filter 4 filters the differential analogue voltage signals output by the electronic volume and level shifter unit 3, to pass only their low frequency components. The filter 4 thereby outputs filtered differential analogue current signals to the terminals A5P and A5N. The current consumption of the filter 4 which is a gm-C type low pass filter with its input by voltage and its output by current, is less than that of the RC type filter 103 with its input and output by voltage shown in FIG. 10. The internal construction of this filter 4 will be described later with reference to FIGS. 4A and 4B.

FIG. 2A is a schematic circuit diagram showing the construction of the D/A converter 2 shown in FIG. 1. The circuit construction will be described first. Digital signals D1 to Dn of n-bit are input to the control terminals of $\underline{n}$ switches 12, respectively. Each of $\underline{n}$ current sources 11 is connected between the common terminal C of the corresponding one of the $\underline{n}$ switches 12, and a positive reference potential. The $\underline{n}$ current sources 11 do not output the same value current. The highest value current is output by the current source 11 corresponding to the switch 12 to which the most significant bit signal Dn. The less significant the bit signal is, the lower the current value output by the current source 11 corresponding to the signal is. The lowest value current is output by the current source 11 corresponding to the switch 12 to which the least significant bit signal D1. All of the positive terminals of the switches 12 are connected to the terminal A1P, and all of the negative terminals N of the switches 12 are connected to the terminal A1N.

Next, the operation of this circuit will be described. Each of the digital signals D1 to Dn is a binary bit signal of "0" or "1". When a bit signal is "0", the switch 12 corresponding to the bit signal connects its common terminal C with its negative terminal N. When a bit signal is "1", the switch 12 corresponding to the bit signal connects its common terminal C with its positive terminal P. When the common and positive terminals C and P are connected, the current source 11 corresponding to the switch 12 outputs the current of its value to the positive output terminal A1P. When the common and negative terminals C and N are connected, the current source 11 corresponding to the switch 12 outputs the current of its value to the negative output terminal A1N.

Consequently, the sum of the currents from the current sources 11 corresponding to the bit signals of "1" is output as a positive analogue current signal I1P (see FIG. 2B) to the positive terminal A1P. Similarly, the sum of the currents from the current sources 11 corresponding to the bit signals of "0" is output as a negative analogue current signal I1N (see FIG. 2B) to the negative terminal A1N. Referring to FIG. 2B, the positive and negative analogue current signals I1P and I1N make a pair of differential analogue current signals reverse in phase to each other. For example, in case of $\underline{n}$=8 (bit), if $\underline{m}$ bit signals are "1", (8−$\underline{m}$) bit signals are "0". The values of the positive and negative analogue current signals I1P and I1N are determined accordingly.

Figure 3A:
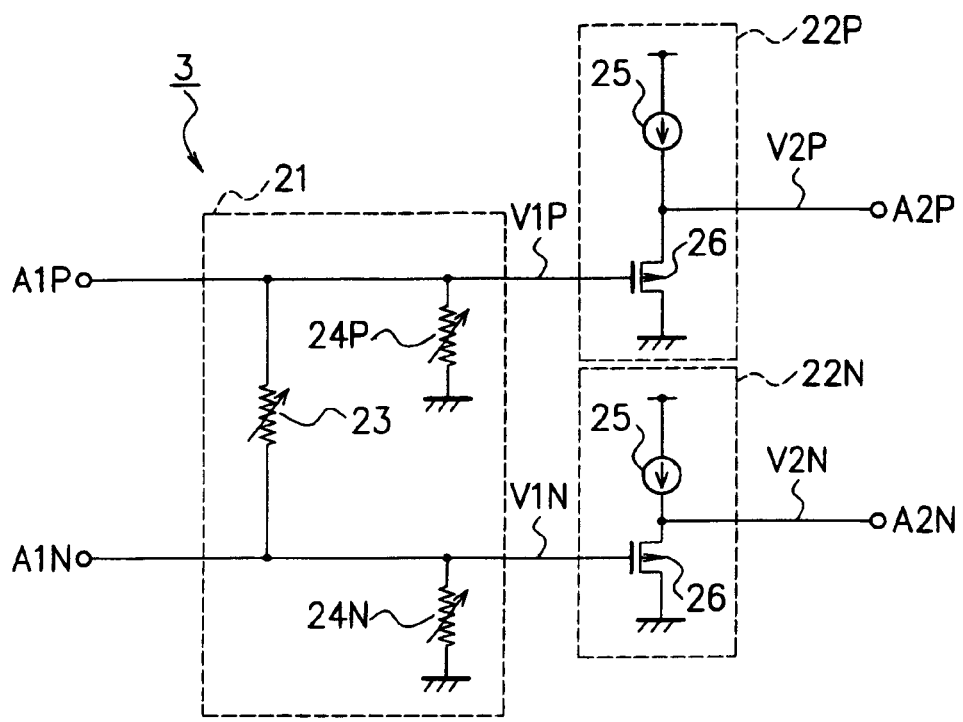
FIG. 3A is a circuit diagram showing the construction of the electronic volume and level shifter unit shown in FIG. 1.

FIG. 3A is a circuit diagram showing the internal construction of the electronic volume and level shifter unit 3. The electronic volume and level shifter unit 3 includes an electronic volume 21 and level shifters 22P and 22N. The electronic volume 21 includes variable resistances 23, 24P, and 24N. Either of the level shifters 22P and 22N includes a current source 25 and a p-channel MOS transistor 26.

The electronic volume 21 will be described first. The variable resistance 23 is connected between the positive and negative analogue input signal lines respectively connected to the positive and negative terminals A1P and A1N. The variable resistance 24P is connected between the positive analogue input signal line connected to the positive terminal A1P, and the ground potential. The variable resistance 24N is connected between the negative analogue input signal line connected to the negative terminal A1N, and the ground potential.

Figure 3B:
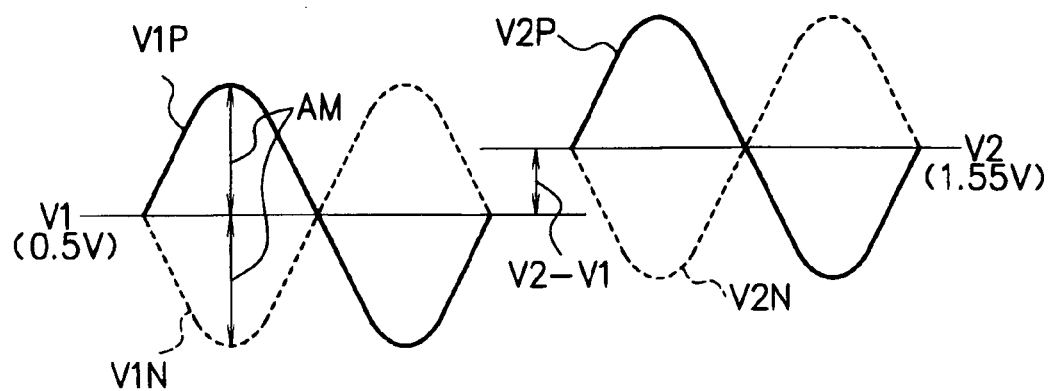
FIG. 3B is a waveform chart for explaining the operation of the electronic volume and level shifter unit.

The variable resistance 24P converts the positive analogue current signal I1P input from the D/A converter 2 shown in FIG. 2A, into a positive analogue voltage signal V1P (see FIGS. 3A and 3B). The positive analogue voltage signal V1P is a voltage that appears on the positive analogue input signal line connected to the positive terminal A1P. Because dispersion in manufacturing process of such semiconductor integrated circuits 1 is inevitable, the level of the DC component of the positive analogue voltage signal V1P must be regulated before shipment of each semiconductor integrated circuits 1, by changing the value of the variable resistance 24P. By this level regulation, for example, the bias level of the DC component of the positive analogue voltage signal V1P is set at V1 (e.g., 0.5 V), as shown in FIG. 3B.

The variable resistance 24N converts the negative analogue current signal I1N input from the D/A converter 2 shown in FIG. 2A, into a negative analogue voltage signal V1N (see FIGS. 3A and 3B). The negative analogue voltage signal V1P is a voltage that appears on the negative analogue input signal line connected to the negative terminal A1N. Like the above, in order to control dispersion in manufacturing process of such semiconductor integrated circuits 1, the value of the variable resistance 24N is changed. For example, the bias level of the DC component of the negative analogue voltage signal V1N is thereby set at V1 (e.g., 0.5 V).

In addition, the value of the variable resistance 23 is changed to regulate the amplitude AM (see FIG. 3B) of the respective AC components of the positive and negative analogue voltage signals V1P and V1N. Dispersion in manufacturing process of such semiconductor integrated circuits 1 is thereby more suppressed.

As described above, the electronic volume 21 has the function of a current/voltage converter for converting D/A-converted analogue current signals into analogue voltage signals, as well as the function of regulating the levels of analogue voltage signals. Unlike the electronic volume 107 shown in FIG. 10, this electronic volume 21 does not include the operational amplifier 106, but can be made up only from the three variable resistances 23, 24P, and 24N. This makes it possible to realize such a reduced-size electronic volume 21 with its reduced current consumption, as a result, a reduced-size semiconductor integrated circuit 1 with its reduced current consumption.

Next, the level shifter 22P will be described. The p-channel MOS transistor 26 has its gate connected to the positive terminal A1P, its source connected to the positive output terminal A2P, and its drain connected to the ground potential. The current source 25 is connected between the positive reference potential and the source of the p-channel MOS transistor 26.

Next, the level shifter 22N will be described. The p-channel MOS transistor 26 has its gate connected to the negative terminal A1N, its source connected to the negative output terminal A2N, and its drain connected to the ground potential. The current source 25 is connected between the positive reference potential and the source of the p-channel MOS transistor 26.

Referring to FIGS. 3A and 3B, when the positive analogue voltage signal V1P whose DC bias level is V1 (e.g., 0.5 V) is input to the level shifter 22P, the level shifter 22P can output a positive analogue voltage signal V2P whose DC bias level is V2 (e.g., 1.55 V).

Similarly, when the negative analogue voltage signal V1N whose DC bias level is V1 (e.g., 0.5 V) is input to the level shifter 22N, the level shifter 22N can output a negative analogue voltage signal V2N whose DC bias level is V2 (e.g., 1.55 V).

These level shifters 22P and 22N are for raising the DC bias level V1 to the DC bias level V2 necessary for input of the subsequent filter 4 (see FIG. 1). The DC bias level V1 can be controlled by the electronic volume 21, but it is difficult for the electronic volume 21 to raise the DC bias level to more than about 0.5 V, because of the characteristics of the current source (MOS transistor) 11 in the D/A converter 2 (see FIG. 2A). For this reason, the level shifters 22P and 22N are required for raising the DC bias level V1 (about 0.5 V) to the DC bias level V2 (about 1.55 V) necessary for input of the filter 4. Thus, if the electronic volume 21 can output the differential analogue voltage signals whose DC bias level reaches the level necessary for input of the filter 4, such level shifters 22P and 22N are not required.

Figure 4A:
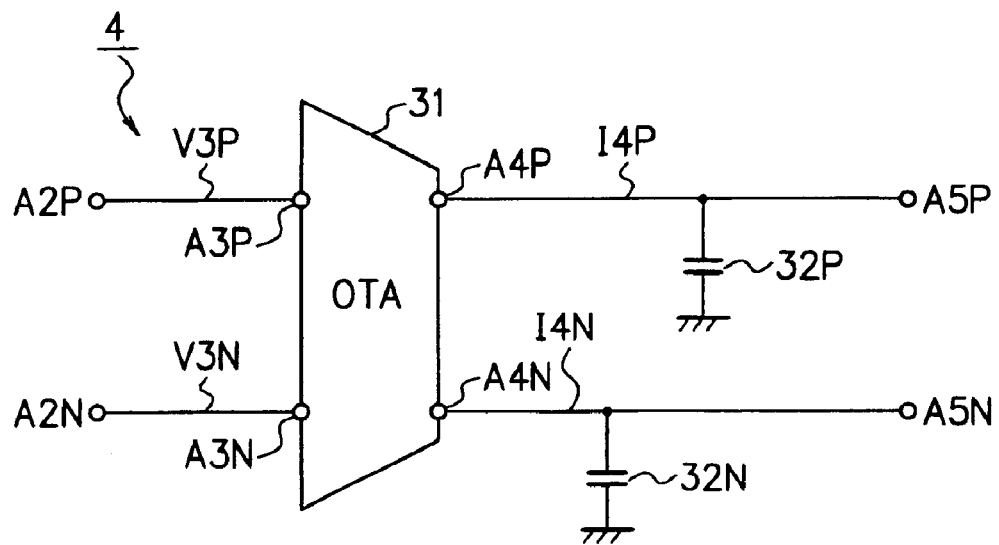
FIG. 4A is a block circuit diagram showing the construction of the filter shown in FIG. 1.

FIG. 4A is a block circuit diagram showing the internal construction of the filter 4 shown in FIG. 1. The filter 4 is a gm-C type low pass filter with its input by voltage and its output by current. The filter 4 includes an OTA (Operational Transconductance Amplifier) 31 and capacitances 32P and 32N. The OTA 31 has a positive input terminal A3P, a negative input terminal A3N, a positive output terminal A4P, and a negative output terminal A4N. The positive and negative input terminals A3P and A3N are connected to the positive and negative terminals A2P and A2N, respectively. The positive and negative output terminals A4P and A4N are connected to the positive and negative terminals A5P and A5N, respectively. The capacitance 32P is connected between the positive analogue output signal line between the positive terminals A4P and A5P, and the ground potential. The capacitance 32N is connected between the negative analogue output signal line between the negative terminals A4N and A5N, and the ground potential.

Figure 4B:
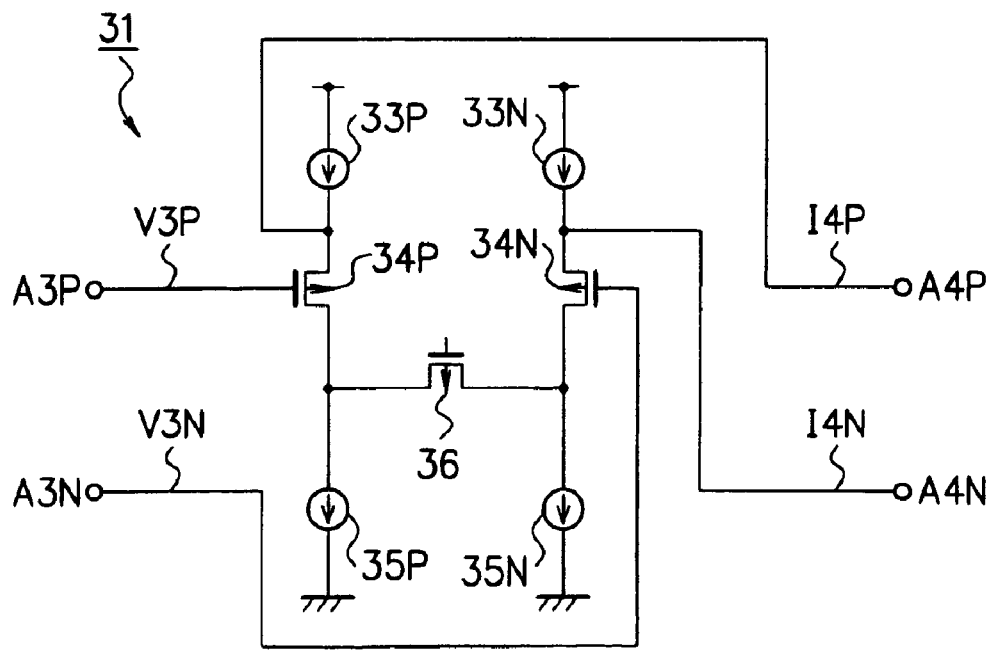
FIG. 4B is a circuit diagram showing the construction of the OTA shown in FIG. 4A.

FIG. 4B is a circuit diagram showing the internal construction of the OTA 31. The positive input and output terminals A3P and A4P are connected to the gate and source of a p-channel MOS transistor 34P, respectively. A current source 33P is connected between the positive reference potential and the source of the p-channel MOS transistor 34P. Another current source 35P is connected between the drain of the p-channel MOS transistor 34P, and the ground potential.

The negative input and output terminals A3N and A4N are connected to the gate and source of a p-channel MOS transistor 34N, respectively. A current source 33N is connected between the positive reference potential and the source of the p-channel MOS transistor 34N. Another current source 35N is connected between the drain of the p-channel MOS transistor 34N, and the ground potential. A p-channel MOS transistor 36 has its gate connected to a predetermined reference potential, and its source and drain respectively connected to the drains of the p-channel MOS transistors 34P and 34N. An n-channel MOS transistor may be used in place of the p-channel MOS transistor 36. In any case, it serves as a resistance.

Into the OTA 31, a positive analogue voltage signal V3P (at the same voltage as the voltage signal V2P) is input through its positive input terminal A3P, and a negative analogue voltage signal V3N (at the same voltage as the voltage signal V2N) is input through its negative input terminal A3N. The OTA 31 then outputs a positive analogue current signal I4P through its positive output terminal A4P, and a negative analogue current signal 14N through its negative output terminal A4N. The higher the positive analogue voltage signal V3P is, the less the current flowing between the source and drain of the p-channel MOS transistor 34P is. The positive analogue current signal I4P increases accordingly. Similarly, the higher the negative analogue voltage signal V3N is, the less the current flowing between the source and drain of the p-channel MOS transistor 34N is. The negative analogue current signal 14N increases accordingly. The OTA 31 converts the differential analogue voltage signals V3P and V3N into the differential analogue current signals I4P and I4N, respectively, and outputs them.

As described above, unlike the RC type filter 103 shown in FIG. 10, the gm-C type filter 4 includes therein no operational amplifier but the OTA 31. In general, the gm-C type filter 4 includes about five OTAs 31, though the number depends on filter factor. The current consumption of each such OTA 31 is 0.1 mA at most. Contrastingly, the RC type filter 103 shown in FIG. 10 includes about five operational amplifiers in general, and each such operational amplifier has need of its current consumption much as 2 to 3 mA. Thus the gm-C type filter 4 according to this embodiment affords a remarkable reduction of current consumption in comparison with the RC type filter 103 shown in FIG. 10. D/A converting systems of this kind are used in portable telephones or the like, and their high speed operation has been required recently. Even in such a high speed operation, however, the current consumption of the semiconductor integrated circuit 1 according to this embodiment can be held little, and so battery lives in a portable telephone or the like using the semiconductor integrated circuit 1 become long. Besides, since the occupying area of each OTA 31 is smaller than that of each operational amplifier, the occupying area of the gm-C type filter 4 including the OTAs 31 is smaller than that of the RC type filter 103 shown in FIG. 10 including the operational amplifiers. Thus a reduced-size D/A converting system can be obtained.

Besides, by making up the electronic volume 21 from three variable resistances, the operational amplifier 106 in the electronic volume 107 shown in FIG. 10 can be eliminated. The electronic volume 21 is thereby obtained with its small occupying area and its little current consumption. This makes it possible to realize a reduced-size semiconductor integrated circuit 1 with its reduced current consumption.

Besides, in the D/A converting system shown in FIG. 10, since the resistance 102 is connected as an external resistance to the exterior of a semiconductor chip, the size of the whole D/A converting system can not but be great. According to this embodiment, however, the electronic volume 21 has both the function of the electronic volume 107 shown in FIG. 10, and the function of the resistance 102 as a current/voltage converter. Since the electronic volume 21 can be incorporated in the semiconductor chip and the external resistance can be eliminated, a reduced-size semiconductor integrated circuit 1 can be obtained.

Figure 5:
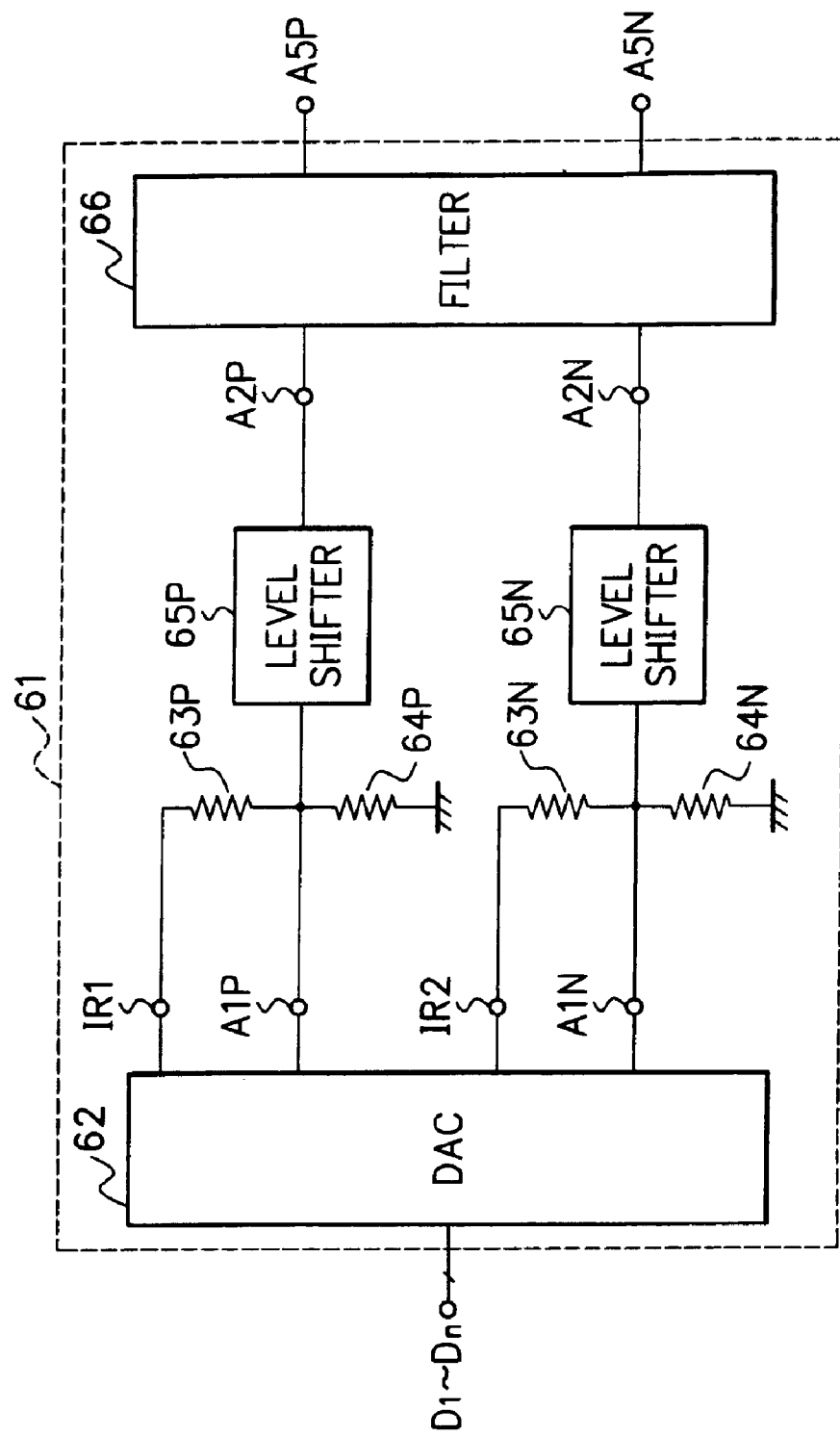
FIG. 5 is a block circuit diagram showing the construction of another semiconductor integrated circuit to realize another D/A converting system according to an embodiment of the present invention.

FIG. 5 is a block circuit diagram showing the construction of another semiconductor integrated circuit 61 to realize another D/A converting system according to an embodiment of the present invention. In this semiconductor integrated circuit 61, an electronic volume is made up from fixed resistances 63P, 64P, 63N, and 64N, differently from the semiconductor integrated circuit 1 wherein the variable resistances 23, 24P, and 24N are used (see FIG. 1).

A D/A converter (DAC) 62 having received digital signals D1 to Dn outputs positive and negative analogue current signals respectively to positive and negative terminals A1P and A1N. Further, the D/A converter 62 outputs fixed reference current signals of the same value to terminals IR1 and IR2. The internal construction of this D/A converter 62 will be described later with reference to FIG. 6.

The fixed resistance 63P is connected between the terminals IR1 and A1P. The fixed resistance 64P is connected between the terminal A1P and the ground potential. The fixed resistance 63N is connected between the terminals IR2 and A1N. The fixed resistance 64N is connected between the terminal A1N and the ground potential.

A level shifter 65P has the same construction as the level shifter 22P shown in FIG. 3A, and its input and output are connected to the terminals A1P and A2P, respectively. A level shifter 65N has the same construction as the level shifter 22N shown in FIG. 3A, and its input and output are connected to the terminals A1N and A2N, respectively. A filter 66 has the same construction as the filter 4 shown in FIG. 4A. The filter 66 has its inputs respectively connected to the terminals A2P and A2N, and its outputs respectively connected to the terminals A5P and A5N.

The above fixed resistances 63P and 63N are for adjusting the levels of the DC components of positive and negative analogue voltage signals, respectively. The fixed resistances 64P and 64N are for adjusting the amplitudes of the AC components of the differential analogue voltage signals comprising the positive and negative analogue voltage signals.

The values of these fixed resistances 63P, 64P, 63N, and 64N can not be changed once they were manufactured, differently from variable resistances. They, however, have the effect of suppressing dispersion in manufacturing. The reason is as follows. These fixed resistances 63P, 64P, 63N, and 64N, and a fixed resistance 73 in the D/A converter 62 shown in FIG. 6, which will be described later, are manufactured into the same type and the same unit. Thus they have the same tendency and the same amount of deviation. Namely, these fixed resistances have equal errors of the same positive or negative sign. As a result, their deviations are cancelled by one another, thereby suppressing dispersion in voltage values output to the output terminals A2P and A2N.

Figure 6:
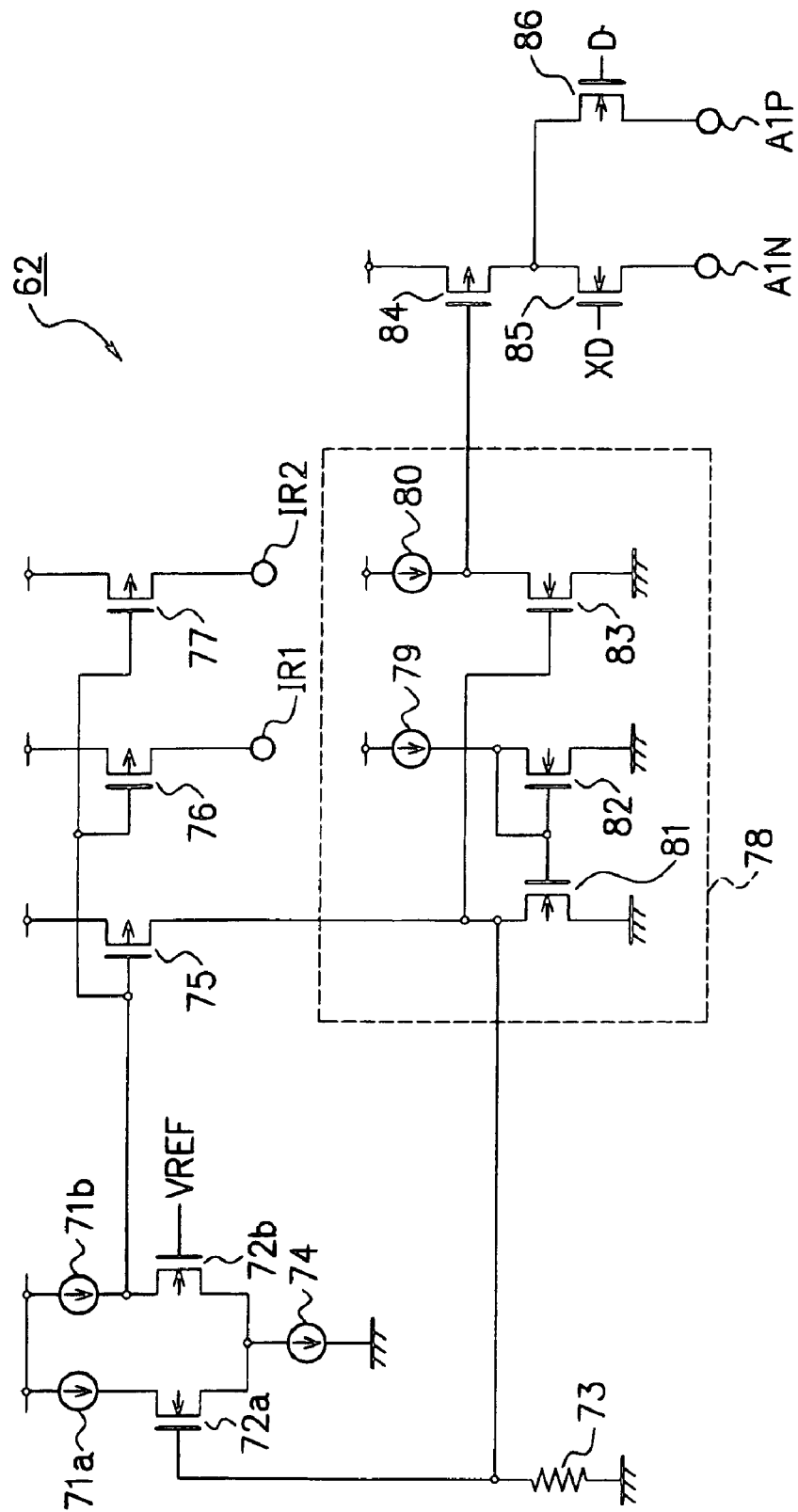
FIG. 6 is a circuit diagram showing the construction of the D/A converter shown in FIG. 5.

FIG. 6 is a circuit diagram showing the internal construction of the D/A converter 62 shown in FIG. 5. A resistance 73 is connected between the ground potential and the node between the gate of an n-channel MOS transistor 72a and the drain of an n-channel MOS transistor 81. A predetermined reference potential VREF is input to the gate of an n-channel MOS transistor 72b. A current source 71a is connected between a positive reference potential and the drain of the n-channel MOS transistor 72a. A current source 71b is connected between the positive reference potential and the drain of the n-channel MOS transistor 72b. A current source 74 is connected between the ground potential and the node between the sources of the n-channel MOS transistors 72a and 72b.

The drain of the n-channel MOS transistor 72b is connected to each gate of p-channel MOS transistors 75, 76, and 77. Each source of the p-channel MOS transistors 75, 76, and 77 is connected to the positive reference potential. The drains of the p-channel MOS transistors 76 and 77 are connected to the terminals IR1 and IR2, respectively. Fixed reference current signals of the same value are output through the terminals IR1 and IR2. The drain of the p-channel MOS transistor 75 is connected to the drain of the n-channel MOS transistor 81 and the gate of the n-channel MOS transistor 83.

A bias circuit 78 includes transistors 81, 82, and 83, and current sources 79 and 80. The n-channel MOS transistor 81 has its source connected to the ground potential, and its gate connected to the gate of the n-channel MOS transistor 82. The n-channel MOS transistor 82 has its gate and drain connected to each other, and its source connected to the ground potential. The current source 79 is connected between the positive reference potential and the drain of the n-channel MOS transistor 82. The current source 80 is connected between the positive reference potential and the drain of the n-channel MOS transistor 83. The n-channel MOS transistor 83 has its source connected to the ground potential, and its drain connected to the gate of a p-channel MOS transistor 84. An n-channel MOS transistor may be used in place of the p-channel MOS transistor 84.

The p-channel MOS transistor 84 has its source connected to the positive reference potential, and its drain connected to the drains of n-channel MOS transistors 85 and 86. One bit signal D of digital signals D1 to Dn is input to the gate of the MOS transistor 86. The reverse signal XD to the bit signal D is input to the gate of the MOS transistor 85. The sources of the n-channel MOS transistors 86 and 85 are connected to the positive and negative terminals A1P and A1N, respectively. The MOS transistor 84 corresponds to the current source 11 shown in FIG. 2A, and the MOS transistors 85 and 86 correspond to the switch 12 shown in FIG. 2A. That is, the MOS transistor 84 outputs a fixed current. When the bit signal D is at its high level "1", the MOS transistor 86 is turned ON to allow a current to flow between its source and drain. When the reverse signal XD is at its high level "1" (the bit signal D is "0"), the MOS transistor 85 is turned ON to allow a current to flow between its source and drain. Provided are the same number of sets of such MOS transistors 84 to 86 as the number of bits, like the case of FIG. 2A. According to this construction of the D/A converter 62, voltage values can be adjusted by the fixed resistances 63P, 64P, 63N, and 64N shown in FIG. 5, thereby suppressing dispersion in voltage values.

FIG. 7 is a block circuit diagram showing the construction of a semiconductor integrated circuit 51 to realize an analogue-to-digital (A/D) converting system according to an embodiment of the present invention. The semiconductor integrated circuit 51 is made into a single semiconductor chip, and includes a filter 52, an electronic volume and level shifter unit 53, and an A/D converter (ADC) 54. The filter 52 has its input lines respectively connected to positive and negative terminals A2P and A2N, and its output lines respectively connected to positive and negative terminals A5P and A5N. The electronic volume and level shifter unit 53 has its input lines respectively connected to the positive and negative terminals A5P and A5N, and its output lines respectively connected to positive and negative terminals A6P and A6N. The A/D converter 54 has its input lines respectively connected to the positive and negative terminals A6P and A6N, and outputs n-bit digital signals D1 to Dn.

The filter 52 has the same construction as the filter 4 shown in FIGS. 4A and 4B. The internal construction of the electronic volume and level shifter unit 53 will be described below with reference to FIG. 8. The internal construction of the A/D converter 54 will be described later with reference to FIGS. 9A and 9B.

FIG. 8 is a circuit diagram showing the internal construction of the electronic volume and level shifter unit 53 shown in FIG. 7. The electronic volume and level shifter unit 53 includes an electronic volume 21 and level shifters 61P and 61N. The electronic volume 21 has the same construction as that shown in FIG. 3A. The level shifter 61P comprises an operational amplifier 62P. The level shifter 61P lowers the DC bias level of a positive analogue voltage signal, e.g., from 1.5 V to 1.1 V, and then outputs it to the positive terminal A6P. Similarly, the level shifter 61N comprising an operational amplifier 62N, lowers the DC bias level of a negative analogue voltage signal, e.g., from 1.5 V to 1.1 V, and then outputs it to the negative terminal A6N.

The level shifters 61P and 61N may be provided not in the electronic volume and level shifter unit 53 but in the A/D converter 54 (see FIG. 7). In this case, by forming such level shifters 61P and 61N in common with elements in the A/D converter 54, the size of the whole device can be reduced.

Figure 9A:
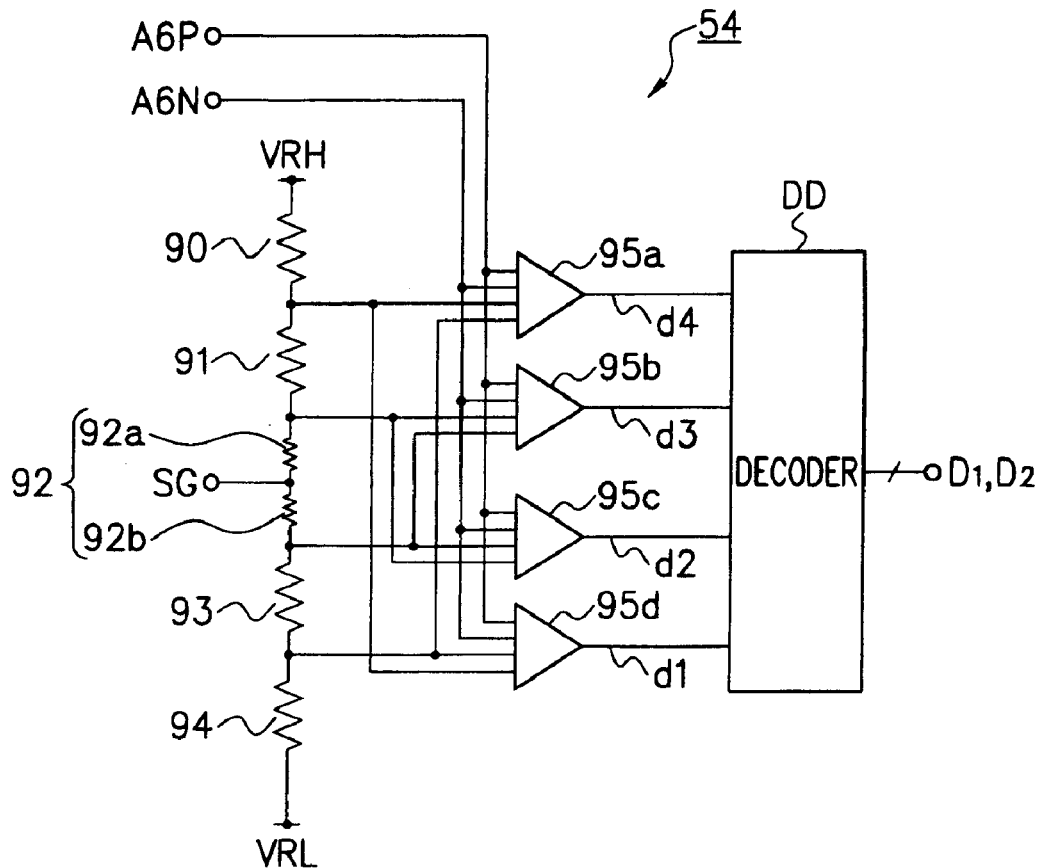
FIG. 9A is a block circuit diagram showing the construction of the A/D converter shown in FIG. 7.

FIG. 9A is a block circuit diagram showing the internal construction of the A/D converter 54 shown in FIG. 7. For the sake of simplification, here will be described the case that differential analogue voltage signals input to the terminals A6P and A6N are converted into 2-bit digital signals D1 and D2 to be output. However, it is a matter of course that the present invention can also apply to conversion into a digital signal of 1-bit or digital signals of more than 2-bit.

Resistances 90, 91, 92, 93, and 94 are connected in series between a high potential VRH and a low potential VRL. The resistance 92 is made up from resistances 92a and 92b connected in series. A terminal SG is connected to the node between the resistances 92a and 92b. Each of four comparators 95a, 95b, 95c, and 95d has the first to fourth input terminals. The first and second input terminals of each comparator are connected to the positive and negative terminals A6P and A6N, respectively.

The comparator 95a has its third input terminal connected to the node between the resistances 90 and 91, and its fourth input terminal connected to the node between the resistances 93 and 94. The comparator 95b has its third input terminal connected to the node between the resistances 91 and 92, and its fourth input terminal connected to the node between the resistances 92 and 93. The comparator 95c has its third input terminal connected to the node between the resistances 92 and 93, and its fourth input terminal connected to the node between the resistances 91 and 92. The comparator 95d has its third input terminal connected to the node between the resistances 93 and 94, and its fourth input terminal connected to the node between the resistances 90 and 91.

Decoder DD receives, as its inputs, bit signals d4, d3, d2, and d1 output by the respective comparators 95a, 95b, 95c, and 95d, and outputs 2-bit digital signals D1 and D2.

Figure 9B:
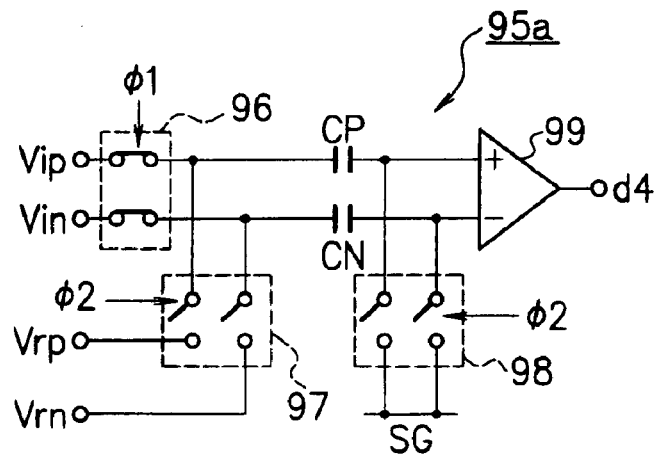
FIG. 9B is a circuit diagram showing the construction of a comparator shown in FIG. 9A.

FIG. 9B is a circuit diagram showing the internal construction of the comparator 95a. Each of the comparators 95b, 95c, and 95d has the same construction as the comparator 95a. The comparator 95a has the first to fourth input terminals Vip, Vin, Vrp, and Vrn. A switch 96 is opened and closed in accordance with a control signal $\phi 1$. Switches 97 and 98 are opened and closed in accordance with a control signal $\phi 2$.

First, the switch 96 is closed, and the switches 97 and 98 are opened. The first input terminal (positive input terminal) Vip is then connected to the positive (+) terminal of a comparator 99 through a capacitance CP. The second input terminal (negative input terminal) Vin is connected to the negative (−) terminal of the comparator 99 through a capacitance CN. The capacitances CP and CN are then charged by the positive and negative input voltages input through the first and second input terminals Vip and Vin, respectively. Next, the switch 96 is opened, and the switches 97 and 98 are closed. The third input terminal (positive reference terminal) Vrp is then connected to the positive (+) terminal of the comparator 99 and the terminal SG through the capacitance CP. The fourth input terminal (negative reference terminal) Vrn is connected to the negative (−) terminal of the comparator 99 and the terminal SG through a capacitance CN. To the positive (+) terminal of the comparator 99, thereby applied is the voltage corresponding to the difference between the positive input voltage input through the first input terminal Vip, and the positive reference voltage input through the third input terminal Vrp. Similarly, to the negative (−) terminal of the comparator 99, applied is the voltage corresponding to the difference between the negative input voltage input through the second input terminal Vin, and the negative reference voltage input through the fourth input terminal Vrn. As the bit signal d4, the comparator 99 outputs "1" when the voltage input to its positive (+) terminal is higher than the voltage input to its negative (−) terminal, and "0" when the voltage input to its negative (−) terminal is higher than the voltage input to its positive (+) terminal.

Referring to FIG. 9A, the decoder DD performs bit judgements in the order of d4, d3, d2, and d1 from the most significant bit d4 to the least significant bit d1. When the bit signal d4 is "1", the decoder DD outputs the digital signals whose low bit D1=1 and high bit D2=1, independently of the values of the bit signals d1 to d3. When the bit signal d4 is "0" and the bit signal d3 is "1", the decoder DD outputs the digital signals whose low bit D1=0 and high bit D2=1, independently of the values of the bit signals d1 and d2. When the bit signals d4 and d3 are "0" and the bit signal d2 is "1", the decoder DD outputs the digital signals whose low bit D1=1 and high bit D2=0, independently of the value of the bit signal d1. When the bit signals d2 to d4 are "0" and the bit signal d1 is "1", the decoder DD outputs the digital signals whose low bit D1=0 and high bit D2=0. Analogue-to-digital conversion is thus performed.

As described above, also in this semiconductor integrated circuit 51 to realize the A/D converting system, the current consumption of the gm-C type filter 52 used is remarkably little in comparison with the RC type filter as described before. Therefore, the current consumption of the whole semiconductor integrated circuit 51 becomes little. This affords long battery lives in a portable telephone or the like using the semiconductor integrated circuit 51.

Figure 11:
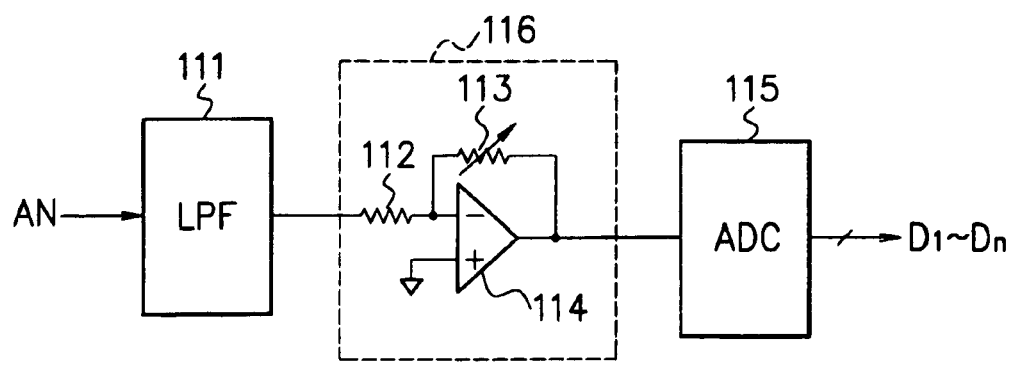
FIG. 11 is a block circuit diagram showing the construction of a conventional A/D converting system.

Besides, by making up the electronic volume 21 from three variable resistances, the operational amplifier 114 in the conventional electronic volume 116 shown in FIG. 11 can be eliminated. The electronic volume 21 is thereby obtained with its small occupying area and its little current consumption. This makes it possible to realize a reduced-size semiconductor integrated circuit 1 with its reduced current consumption.

In the above embodiments, exemplified is the electronic volume 21 in which level control is performed with resistances. However, such level control may be performed with other elements than the resistances, such as transistors and capacitances. Semiconductor integrated circuits for D/A or A/D converting systems according to any of the above embodiments can be used in portable telephones, automobile telephones, cordless telephones, image processors (such as video devices and digital versatile disk (DVD) devices), etc.

The operational characteristics of the above-described semiconductor integrated circuits may vary in accordance with manufacturing process conditions and/or environmental conditions. Next will be described a semiconductor integrated circuit capable of correcting a factor variable in accordance with manufacturing process conditions and/or environmental conditions.

Figure 12:
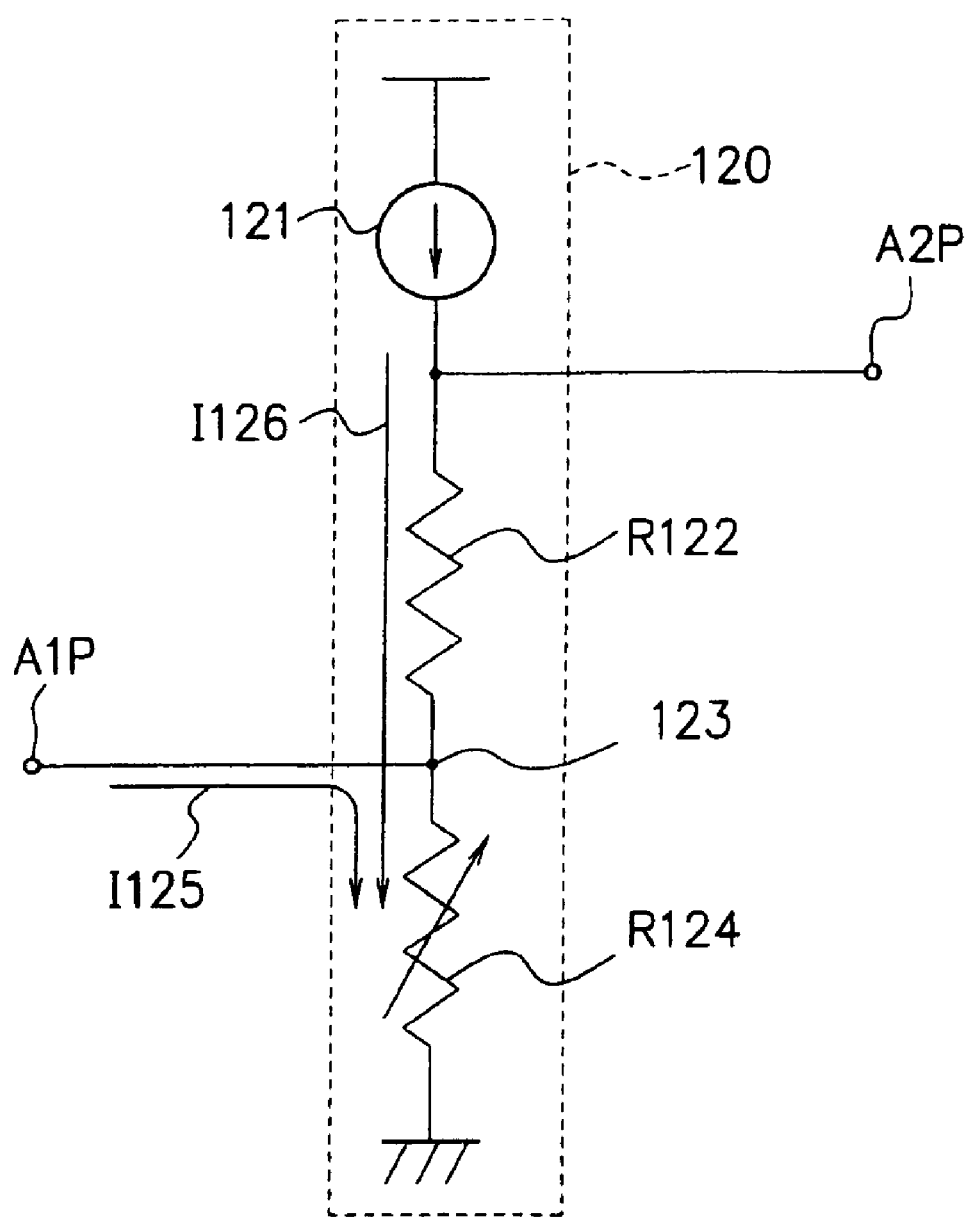
FIG. 12 is a circuit diagram showing the construction of a current-to-voltage converter according to an embodiment of the present invention.

FIG. 12 shows a current-to-volume converter (electronic volume and level shifter unit) 120 for correcting a factor variable in accordance with manufacturing process conditions and/or environmental conditions. This current-to-volume converter 120 is provided between the input and output terminals A1P and A2P shown in FIG. 1 in place of the electronic volume and level shifter unit 3. The same as the current-to-volume converter 120 is provided also between the input and output terminals A1N and A2N shown in FIG. 1.

The input terminal A1P is for inputting an input current I125 that is in inverse proportion to a resistance variation factor Krp. The input current I125 is given by the following expression:

$$I125 = I0 \times f(D)/Krp$$

where I0 represents the central value of the maximum output current of the D/A converter 2 shown in FIG. 1; D does a digital value input to the D/A converter 2; f(D) does a value of a function in proportion to the input digital value D and falls within the range from 0 to 1; and Krp does a variation factor of the value of an LSI-incorporated resistance, which is a variation value of resistances formed on the same semiconductor substrate on which the semiconductor integrated circuit 1 is formed. All resistances formed on the same semiconductor substrate have the same variation factor Krp, which is variable in accordance with manufacturing process conditions and operation environment conditions, because of the nature of the semiconductor process. Since the D/A converter 2 on the stage precedent to the input terminal A1P includes an LSI-incorporated resistance, the input current I125 is in inverse proportion to the resistance variation factor Krp. More specifically, since the D/A converter 62 shown in FIG. 6 includes an LSI-incorporated resistance 73 as described later, the input current I125 is in inverse proportion to the resistance variation factor Krp.

A current source 121 can supply a bias current I126 that is in inverse proportion to the same resistance variation factor as the above resistance variation factor Krp. The bias current I126 is given by the following expression:

$$I126 = Kb \times I0/Krp$$

where Kb represents the central value of the ratio of the bias current I126 to the input current I125 when the above function f(D) is "1". Since the current source 121 includes an LSI-incorporated resistance (resistance 73 in FIG. 6) having the same resistance variation factor as the above resistance variation factor Krp, the bias current I126 is in inverse proportion to the resistance variation factor Krp.

A first resistance R122 is connected between the current source 121 and the input terminal A1P, through which the bias current I126 can flow. Its resistance value is in proportion to the same resistance variation factor as the above resistance variation factor Krp. The first resistance R122 is given by the following expression:

$$R122 = Krp \times R1$$

where R1 represents the central resistance value of the resistance R122.

A second resistance R124 is connected between the input terminal A1P and a reference level terminal (ground terminal), through which the input current I125 and the bias current I126 can flow. Its resistance value is in proportion to the same resistance variation factor as the above resistance variation factor Krp. The second resistance R124 is given by the following expression:

$$R124 = Krp \times R2$$

where R2 represents the central resistance value of the resistance R124.

The output terminal A2P is connected between the current source 121 and the first resistance R122 to output a voltage signal that is independent of the resistance variation factor Krp. The voltage Vm at the node to which the input terminal A1P is connected is given by the following expression:

$$Vm = R124 \times (I125 + I126)$$
$$= Krp \times R2 \times (I0 \times f(D)/Krp + Kb \times I0/Krp)$$
$$= R2 \times I0 \times f(D) + R2 \times Kb \times I0.$$

The voltage Vout at the output terminal A2P is given by the following expression:

$$Vout = Vm + R122 \times I126$$
$$= (R2 \times I0 \times f(D) + R2 \times Kb \times I0) +$$
$$(Krp \times R1) \times (Kb \times I0/Krp)$$
$$= Kb \times I0 \times (R1 + R2) + R2 \times I0 \times f(D).$$

Thus the expression of the output voltage Vout does not include the resistance variation factor Krp of the LSI-incorporated resistance, so the output voltage Vout is independent of the resistance variation factor Krp. That is, the stable output voltage Vout can be obtained irrespective of dispersion in manufacturing process and a change in operation environmental conditions.

By making the second resistance R124 variable, the second resistance R124 can have a function of electronic volume. This current-to-volume converter 120 has a function of electronic volume and level shifter.

As described above, the semiconductor integrated circuit 1 is formed on the same semiconductor substrate. That is, the resistance in the current source 121 and the first and second resistances R122 and R124 are formed on the same semiconductor substrate as LSI-incorporated resistances. Therefore, the resistance in the current source 121 and the first and second resistances R122 and R124 have the same resistance variation factor Krp. This resistance variation factor Krp is variable in accordance with manufacturing process conditions and operation environmental conditions. The current-to-voltage converter 120 can convert its input current signal into a voltage signal Vout in which the factor Krp variable in accordance with manufacturing process conditions and/or operation environmental conditions has been corrected, and output it through the output terminal A2P.

For correcting the resistance variation factor Krp using the electronic volume and level shifter unit 3 shown in FIG. 3A, a method is thinkable in which the resistances 23, 24P, and 24N shown in FIG. 3A are made variable by digital input and the values of them are tuned. But, adding a tuning circuit for this purpose to the semiconductor integrated circuit results in increases in both the area and the current consumption of the semiconductor integrated circuit. Besides, since tuning can not be done in operation of the device, the component of the characteristic variation due to operation environmental conditions must be estimated in advance as a margin upon designing. This requires a redundant design. More specifically, the number of input digital bits of the tuning circuit must increase, which increases the circuit area.

The current-to-voltage converter 120 shown in FIG. 12 can output a voltage signal Vout in which the resistance variation factor Krp has been corrected even without tuning. Even without tuning, the voltage signal is output with the resistance variation factor Krp having been automatically cancelled. Thus the tuning process can be eliminated. Besides, upon designing, an excessive margin need not be taken. Further, with preventing increases in both the area and the current consumption of the semiconductor integrated circuit, the voltage signal in which the resistance variation factor Krp has been corrected can be output.

Besides, for each of the first and second resistances R122 and R124 and the resistance in the current source 121, a resistance with low accuracy suffices for the following reason. A decrease in cost can be achieved thereby. Although a resistance with high accuracy is realized by an external resistance, a resistance with low accuracy can be realized by an LSI-incorporated resistance. Since the current-to-voltage converter 120 according to this embodiment can automatically correct the resistance variation factor Krp even when the resistance variation factor Krp is high, each of the first and second resistances R122 and R124 and the resistance in the current source 121 can be realized by an LSI-incorporated resistance with low accuracy.

FIG. 13 shows a more specific semiconductor integrated circuit 130. The semiconductor integrated circuit 130 includes a D/A converter 62, current-to-voltage converters 131P and 131N, and a filter 66. The D/A converter 62 and filter 66 are the same as those shown in FIG. 5.

The current-to-voltage converter 131P is connected to a bias terminal IR1, an input terminal A1P, and an output terminal A2P. The current-to-voltage converter 131N is connected to a bias terminal IR2, an input terminal A1N, and the above output terminal A2P. Either of the current-to-voltage converters 131P and 131N includes first and second resistances R122 and R124 as in FIG. 12.

The D/A converter 62 includes an LSI-incorporated resistance 73 having the resistance variation factor Krp, as shown in FIG. 6. Under the influence of this LSI-incorporated resistance 73, the bias terminals IR1 and IR2 and the input terminals A1P and A1N receive a bias current I126 and an input current I125, respectively, which are in inverse proportion to the resistance variation factor Krp.

Although the current I125 that is in inverse proportion to the resistance variation factor Krp is input through the input terminals A1P and A1N, either of the current-to-voltage converters 131P and 131N can convert the input current signal into a voltage signal in which the resistance variation factor Krp has been corrected, and output it. Through either of the output terminals A2P and A2N, a stable voltage signal is output irrespective of manufacturing process conditions and/or environmental conditions.

Although the semiconductor integrated circuit as a D/A converting system has been described with reference to FIGS. 12 and 13, the current-to-voltage converters of FIGS. 12 and 13 are applicable also to a semiconductor integrated circuit as an A/D converting system. In such a case, the current-to-voltage converters 131P and 131N are provided instead of the electronic volume and level shifter unit 53 in the A/D converting system shown in FIG. 7. When a current that is in inverse proportion to the resistance variation factor Krp is input through the input terminals A5P and A5N, either of the current-to-voltage converters outputs a voltage signal in which the resistance variation factor Krp has been corrected. As an example in which a current in inverse proportion to the resistance variation factor Krp is input through the input terminals A5P and A5N, there is a case that an LSI-incorporated resistance is used in the filter 52 on the stage precedent to the input terminals A5P and A5N, or that an LSI-incorporated resistance is used on a further precedent stage.

As described above, according to the present invention, since the first and second resistances can function as an electronic volume, the electronic volume can be constructed with no operational amplifier. This makes it possible to realize a semiconductor integrated circuit with its small occupying area and its little current consumption. This affords a reduction in size of a portable telephone or the like using such a semiconductor integrated circuit, and long battery lives in the portable telephone or the like.

Besides, by using elements such as resistances having both the function of an electronic volume and the function of a current/voltage converter, a reduced-size-semiconductor integrated circuit can be realized.

Besides, by using a gm-C type filter including an OTA and a capacitance, as a filter in a semiconductor integrated circuit, the current consumption of the filter can remarkably be reduced in comparison with a conventional RC type filter. Therefore, the current consumption of the whole semiconductor integrated circuit becomes little. This affords long battery lives in a portable telephone or the like using the semiconductor integrated circuit.

The above-described embodiments are only for illustrating the present invention, and so the present invention is not limited to those embodiments. That is, the present invention can be embodied in various other forms without departing from its technical scope and principal features.

What is claimed is:

1. A semiconductor circuit comprising:
a positive signal line to which a positive analogue current signal is inputted;
a negative signal line to which a negative analogue current signal is inputted, said positive and negative analogue current signals being reverse in phase to each other;
a first resistance connected between said positive signal line and a reference potential, said first resistance converting said positive analogue current signal into a positive analogue voltage signal;
a second resistance connected between said negative signal line and said reference potential, said second resistance converting said negative analogue current signal into a negative analogue voltage signal; and
a third resistance connected between said positive and negative lines.

2. The circuit according to claim 1, wherein each of said first to third resistances comprises a variable resistance.

3. The circuit according to claim 2, further comprising a filter for filtering differential analogue voltage signals comprising said positive analogue voltage signal and said negative analogue voltage signal input through said positive and negative signal lines.

4. The circuit according to claim 3, wherein said filter comprises a low pass filter.

5. The circuit according to claim 4, wherein said filter includes an OTA and a capacitance.

6. The circuit according to claim 5, further comprising level shifters for respectively shifting the levels of the DC components of the signals on said positive and negative signal lines,
wherein said filter filters said differential analogue signals comprising said signals on said positive and negative signal lines, whose levels have been shifted by said level shifters.

7. The circuit according to claim 2, further comprising a filter for filtering first differential analogue signals comprising positive and negative analogue signals reverse in phase to each other, and outputting filtered positive and negative analogue signals respectively to positive and negative signal lines.

8. The circuit according to claim 7, wherein said filter comprises a low pass filter.

9. The circuit according to claim 8, wherein said filter includes an OTA and a capacitance.

10. The circuit according to claim 9, further comprising level shifters for respectively shifting the levels of the DC components of the positive and negative analogue signals on said positive and negative signal lines.

11. A semiconductor circuit comprising:
a current/voltage converter which converts differential analogue current signals reverse in phase to each other into differential analogue voltage signals whose levels have been regulated,
wherein said current/voltage converter includes first and second elements for respectively controlling the levels of the DC components of two analogue voltage signals comprising said differential analogue voltage signals, and a third element for controlling the amplitude of the AC components of said differential analogue voltage signals.

12. The circuit according to claim 11, wherein each of said first to third elements comprises a resistance.

13. The circuit according to claim 12, wherein each of said first to third elements comprises a variable resistance.

14. The circuit according to claim 13, further comprising a filter for filtering said differential analogue voltage signals converted by said current/voltage converter.

15. The circuit according to claim 14, wherein said filter comprises a low pass filter.

16. The circuit according to claim 15, wherein said filter includes an OTA and a capacitance.

17. The circuit according to claim 16, further comprising level shifters for respectively shifting the levels of the DC components of said two analogue voltage signals comprising said differential analogue voltage signals converted by said current/voltage converter,
wherein said filter filters said differential analogue voltage signals whose levels have been shifted by said level shifters.

18. The circuit according to claim 13, further comprising a filter for filtering an input signal, and outputting a filtered analogue current signal to said current/voltage converter.

19. The circuit according to claim 18, wherein said filter comprises a low pass filter.

20. The circuit according to claim 19, wherein said filter includes an OTA and a capacitance.

21. The circuit according to claim 20, further comprising level shifters for respectively shifting the levels of the DC components of said two analogue voltage signals comprising said differential analogue voltage signals converted by said current/voltage converter.

* * * * *